(12) United States Patent
Leroux

(10) Patent No.: US 8,204,704 B2
(45) Date of Patent: Jun. 19, 2012

(54) MOS CAPACITANCE TEST STRUCTURE AND ASSOCIATED METHOD FOR MEASURING A CURVE OF CAPACITANCE AS A FUNCTION OF THE VOLTAGE

(75) Inventor: Charles Leroux, Noyarey (FR)

(73) Assignee: Commissariat a l'Energie Atomique, Paris (FR)

( * ) Notice: Subject to any disclaimer, the term of this patent is extended or adjusted under 35 U.S.C. 154(b) by 497 days.

(21) Appl. No.: 12/408,883

(22) Filed: Mar. 23, 2009

(65) Prior Publication Data

US 2009/0240451 A1  Sep. 24, 2009

(30) Foreign Application Priority Data

Mar. 21, 2008  (FR) ..................... 08 01576

(51) Int. Cl.
*G01R 27/00* (2006.01)
*H01L 23/58* (2006.01)
(52) U.S. Cl. ............ 702/65; 702/1; 702/57; 702/64; 257/48; 257/E23.001; 438/14; 438/17
(58) Field of Classification Search ............ 257/48, 257/E23.001; 438/14, 17; 702/1, 57, 64, 702/65
See application file for complete search history.

(56) References Cited

U.S. PATENT DOCUMENTS

| | | | | |
|---|---|---|---|---|
| 3,646,527 A | * | 2/1972 | Wada et al. | 365/184 |
| 5,907,517 A | * | 5/1999 | Komarek et al. | 365/189.07 |
| 6,008,664 A | * | 12/1999 | Jett et al. | 324/762.02 |
| 6,549,029 B1 | | 4/2003 | Hsieh et al. | |
| 6,756,607 B2 | * | 6/2004 | Yamashita et al. | 257/48 |
| 6,784,518 B1 | * | 8/2004 | Merckel et al. | 257/531 |
| 6,838,869 B1 | * | 1/2005 | Rogers et al. | 324/762.01 |
| 6,870,375 B2 | | 3/2005 | Sarma et al. | |
| 7,069,525 B2 | | 6/2006 | Bhushan et al. | |
| 2003/0117151 A1 | * | 6/2003 | Kunikiyo et al. | 324/658 |
| 2004/0000917 A1 | | 1/2004 | Sarma et al. | |
| 2005/0090916 A1 | * | 4/2005 | Aghababazadeh et al. | 700/90 |
| 2005/0099188 A1 | * | 5/2005 | Baxter | 324/678 |

OTHER PUBLICATIONS

C. Leroux et al. "Characterization and modeling of nanometric $SiO_2$ dielectrics" *Microelectronic Engineering*, vol. 72, Issues 1-4, Apr. 2004, pp. 121-124.
B. W. McGaughy, J.C. Chen, D. Sylvester, C. Hu, "A Simple Method for On-Chip Sub-Femto Farad Interconnect Capacitance Measurement," *IEEE Electron Device Letters*, vol. 18, No. 1, pp. 21-23, Jan. 1997.

* cited by examiner

*Primary Examiner* — Minh-Loan T Tran
*Assistant Examiner* — William Harriston
(74) *Attorney, Agent, or Firm* — Stroock & Stroock & Lavan LLP

(57) ABSTRACT

A test structure for precise characterization of an MOS stack has two semiconductor devices $DT_1$ and $DT_2$ comprising MOS transistors. The dimensions (length $L_i$, width $W_i$) of the transistors of the first device $T_i$ and the dimensions (length $L'_i$, width $W'_i$) of the transistors $T'_i$ of the second device are selected so that the sum of the lengths of the transistors on the one hand, and the sum of the widths of the transistors on the other hand, are respectively equal in the two devices, and so that the surface area difference $S_{equiv}$ between the two devices is nonzero. An associated measurement method is used to calculate the curve of the difference capacitance between the two devices as a function of the voltage by means of a capacimeter. By placing each of the devices as the load of a suitably controlled CMOS inverter, this curve can be recorded by a dynamic measurement method based on measuring the current in each inverter.

15 Claims, 13 Drawing Sheets

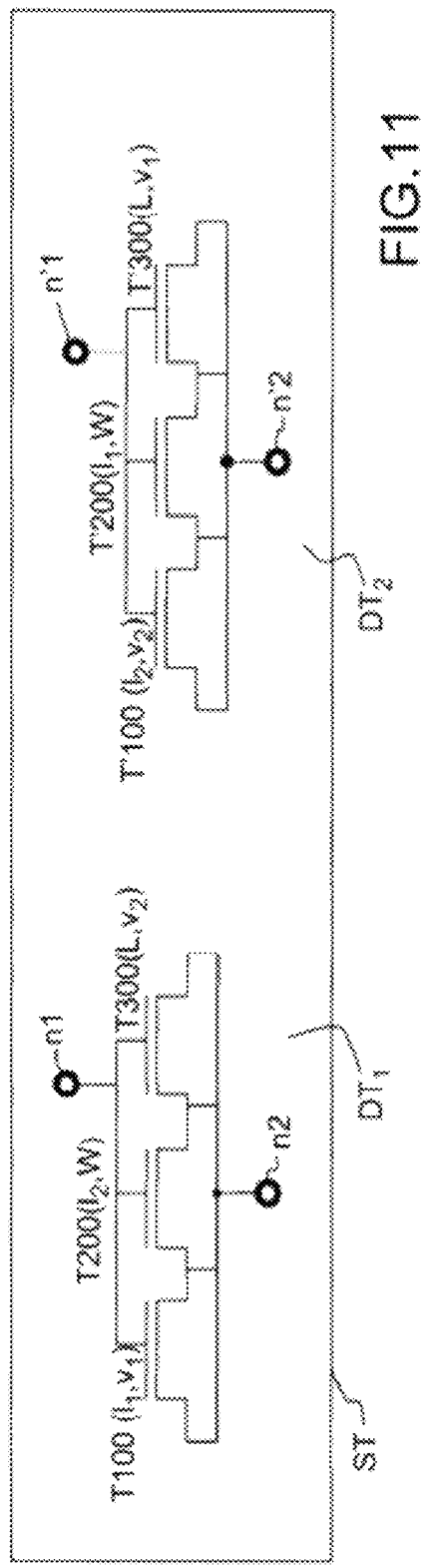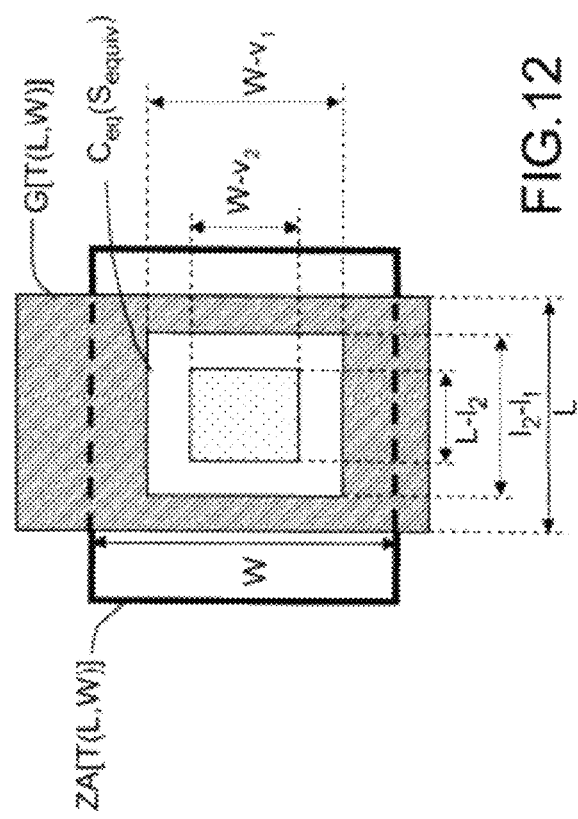
FIG.11
FIG.12

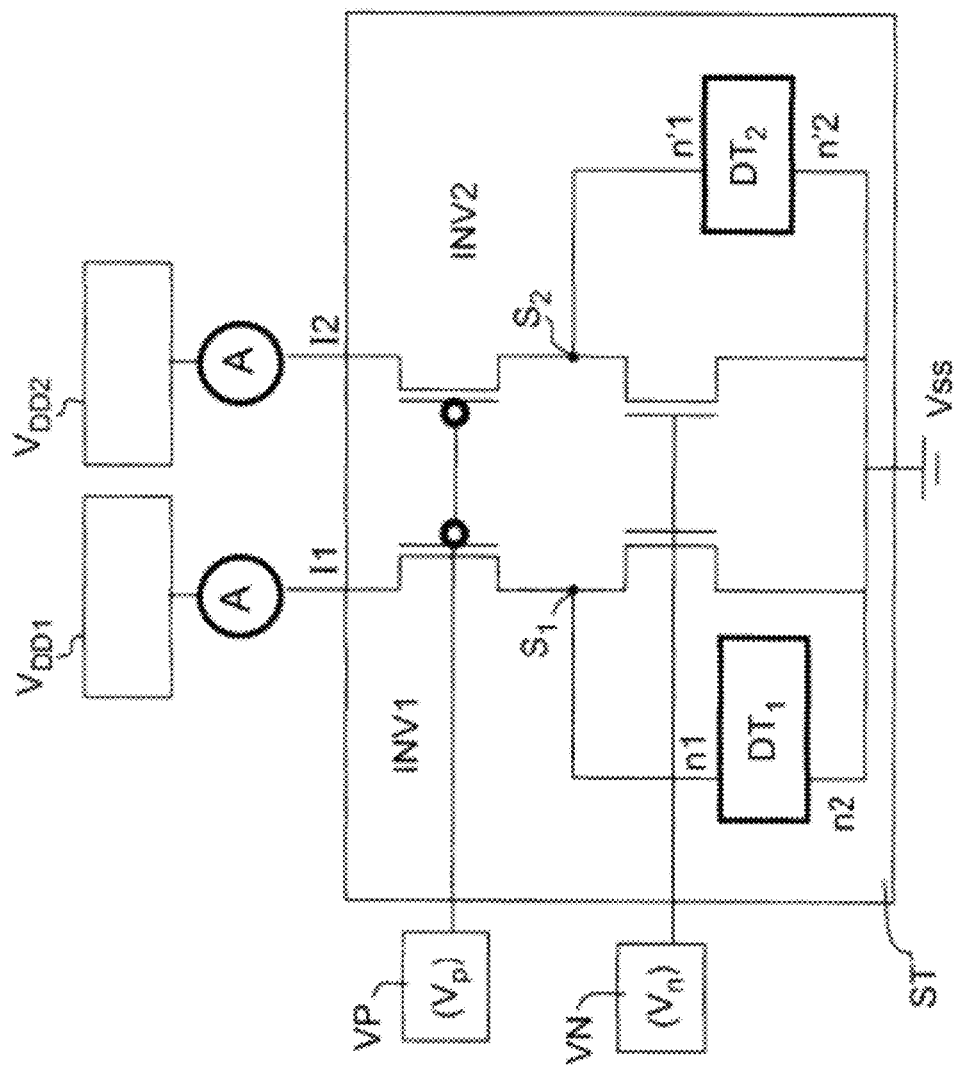
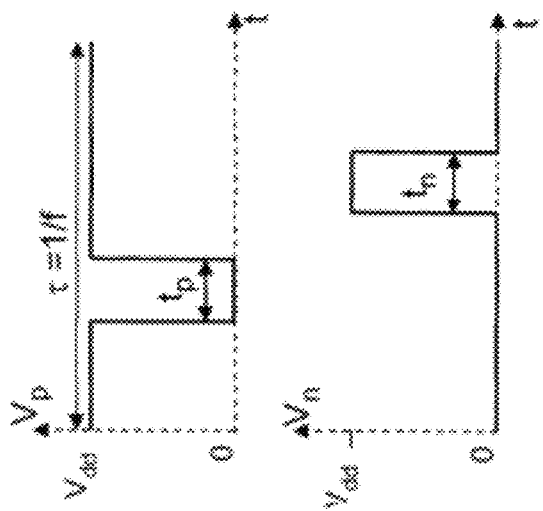
FIG. 13

MOS CAPACITANCE TEST STRUCTURE AND ASSOCIATED METHOD FOR MEASURING A CURVE OF CAPACITANCE AS A FUNCTION OF THE VOLTAGE

CROSS-REFERENCE TO RELATED APPLICATION

The present application claims the benefit of French Patent Application No. 08 01576, filed Mar. 21, 2008, which is hereby incorporated by reference in its entirety.

FIELD OF THE INVENTION

The invention relates to the characterization of technological processes for producing semiconductor devices, and more particularly to a test structure for characterizing an MOS gate/gate oxide/semiconductor stack by recording an associated C(V) curve.

BACKGROUND OF THE INVENTION

C(V) curves, which give the MOS capacitance as a function of the gate voltage, make it possible to determine characteristic dimensions of an MOS stack, such as in particular the gate oxide thickness given as silicon oxide equivalent, which is denoted EOT (Equivalent Oxide Thickness), and the flatband voltage (FBV) i.e. the voltage at which the valence and conduction bands in the semiconductor are flat.

These characteristic dimensions are used to characterize, monitor and compare electronic processes according to the recommendations established by the ITRS body ("International Technology Roadmap for Semiconductors") in its roadmap. This roadmap, which assesses the progress of miniaturization (Moore's law) in technological generations referred to as "nodes", associates characteristic dimensions with each node, these comprising in particular the gate oxide thickness as EOT.

The invention addresses the most advanced technological processes, for which the EOT is around one nanometre or even less.

For these nanometric processes, the characterization of MOS gate/oxide/semiconductor stacks requires that very precise curves be obtained, and then that the parameters of the stack (EOT, FBV, . . . ) be evaluated by models taking into account, in particular, quantum effects.

The C(V) curves of an MOS stack are conventionally obtained by means of a commercial impedance analyzer, for example the analyzer marketed under the name Agilent 4284A, which allows a complex impedance measurement to be carried out in the small-signal range (superposition of a small-signal voltage with a DC voltage).

For nanometric processes, these techniques of recording curves from conventional test structures do not allow the desired precision and reliability to be obtained, because numerous factors interfere with the impedance measurements.

Specifically, with surfaces measuring 100 microns by 100 microns which make it possible to obtain capacitances of the order of a few hundred picofarads ($10^{-12}$ farads), the measurements are affected by the increase in leakage currents through the gate oxide due to the tunnel effect. It is known that the use of smaller MOS transistor surfaces, for example of the order of 10 microns by 10 microns, allows this problem of stray leakage current to be overcome by reducing the access resistances, as described for example in the publication by C. Leroux et al. "Characterization and modeling of nanometric $SiO_2$ dielectrics" *Microelectronic Engineering*, Volume 72, Issues 1-4, April 2004, pages 121-124.

Owing to their lower capacitance value (picofarads), these structures with smaller dimensions are further affected by the relative increase in the stray capacitances, whether these are stray capacitances inherent to the MOS transistor structure or capacitances belonging to the measuring apparatus and interconnection capacitances between the structure to be tested and the measuring apparatus.

More precisely, three categories of stray capacitances are thus involved in the measurement. These are the stray capacitances induced by the MOS structure itself; the stray capacitances introduced by the interconnection lines joining the MOS structure to the test pads onto which the electrodes of the measuring apparatus will be placed; and the stray capacitances associated with the measuring apparatus.

FIGS. 1 and 2 illustrate the stray capacitances induced by an MOS transistor structure. An MOS transistor (FIG. 1) comprises an active transistor zone ZA in the substrate, on which a control gate G makes it possible to control a channel between the diffusion zones. The dimensions of a transistor are the dimensions of the channel: the length L of the channel, that is to say the longitudinal distance between the source and drain diffusion zones; and its width, which is the transverse length of the channel. These are the design lengths and widths on reticles for the fabrication of transistors. The surface area of the transistor is thus given by the product L·W. FIG. 2 shows the source diffusion zone S and the drain diffusion zone D, the gate G comprising a gate oxide $g_{ox}$ arranged on the substrate over the channel zone cc, and the gate electrode $g_e$ on the gate oxide, as well as the spacers or insulators e1, e2 conventionally provided laterally on the sides of the gate.

The stray capacitances inherent to such an MOS transistor structure are the capacitances associated with the perimeter of the transistor. These are, as is well known:

the corner capacitances Ca1, Ca2, Ca3, Ca4 (FIG. 1) of three-dimensional nature, at the position of the four corners corresponding to the vertices of the gate zone G with dimensions W by L, which overhangs the active zone ZA;

the stray capacitances of the gate edge on the active zone, which comprise the capacitances Cw along its width W and the capacitances Cl along its length L. Referring to the example of the 45 nanometre technology node, these edge stray capacitances are of the order of 0.2 femtofarad ($10^{-15}$ farad) per micrometre of width W or length L. The capacitances Cw comprise the capacitances via the spacers and the capacitances via the oxide, between the gate and the source and drain diffusion zones. It is this which is illustrated in FIG. 2: for the capacitances Cw along the width W, the stray capacitance c9 corresponds to the stack comprising the gate electrode $g_e$/spacer e1/diffusion zone S; and the stray capacitance c10 corresponds to the stack comprising the gate electrode $g_e$/gate oxide $g_{ox}$/diffusion zone S. The capacitances Cl are associated with the specific capacitances observed at the active zone edge.

FIG. 3 illustrates the stray capacitances induced by the test pads provided on the semiconductor device, in order to receive the measurement tips (electrodes) of the measuring apparatus, and by the interconnection lines, typically aluminium lines, which allow the gate and the source and drain diffusion zones to be connected to these test pads. In the example, the semiconductor device is an MOS transistor T formed in a semiconductor substrate B and comprising a channel cc between two diffusion zones, source S and drain D, formed in the substrate, and a gate G (gate electrode and gate oxide, not differentiated in the figure). The device has two test pads p1 and p2, onto each of which a measurement tip of a measuring apparatus (not shown) will be placed. These pads are produced in the same surface plane, typically in a metallization level of the device, above the gate level of the transistor. They are, for example, metal platelets measuring a few tens of square micrometres. A connection line 11, which comprises the test pad p1, connects the two diffusion zones by corresponding contact pins. The gate G extends beyond the channel of the transistor, into a zone where it is insulated from the substrate by a thick dielectric i, allowing the gate to be connected to the other test pad p2 via a corresponding contact pin. The capacitances associated with the interconnection elements (test pads, interconnection line or contact pins) comprise in particular the following capacitances: the capacitance c4 between the gate contact pin of the pad p2 and the substrate; the capacitance c5 between the pad p2 and the substrate; the capacitance c6 between the connection line 11 and the substrate; the capacitance c7 between the pad p1 and the substrate; and the capacitance c8 between the two pads p1 and p2, which depends on the distance between the two pads. Referring to the example of the 45 nanometre technology node, the magnitude of each of the interconnection capacitances c5 and c7 induced by the test pads (p1 or p2), measuring 100 microns by 100 microns, is of the order of one picofarad. In practice, depending on the topology of the interconnection elements in relation to the substrate, a dispersion of the order of 10 percent is observed in the interconnection capacitances, particularly when these capacitances are formed with the insulation dielectric i for which the fabrication constraints are less compared with the constraints applying to the gate oxide.

FIG. 4 lastly illustrates the stray capacitances c1, c2, c3 associated with a measuring apparatus 3, which typically comprises a capacimeter and a handling device ("prober"). An arbitrary semiconductor device to be tested, referenced 1, is arranged in the conventional way on a substrate holder 2. The measuring apparatus 3 controls two measurement tips 4 and 5, which are applied onto the semiconductor device at two test points. The stray capacitances are the capacitances c1 and c2 between each tip and the substrate, and the stray capacitance c3 between two tips. Together, these stray capacitances may amount to a value of the order of one picofarad ($10^{-12}$ farad). This value varies according to the configuration of the tips and their position with respect to the substrate holder.

For the advanced technological processes of interest to us, these various stray capacitances are of the order of magnitude of the capacitances to be measured.

Lastly, the measurements are further affected by the tolerance in the dimensions of the MOS structure. This is because, in order to facilitate technological comparisons, the value of the capacitance is conventionally calculated per unit area, which is to say, in the C(V) curves which are used, the measured capacitance is divided by the surface area of the MOS structure on which it has been recorded. The precision of the C(V) curves obtained then depends on the precision in the dimensions of the MOS structure, which may be evaluated at 12 percent of the nominal length of the technology in question according to the ITRS criteria ($3\sigma$ dispersion).

Thus, the imprecisions in the dimensions of the transistors are added to the imprecisions associated with the stray capacitances. The reason is, as we have seen, that in reality a capacitance per unit area is calculated. A measured capacitance is therefore divided by the surface area of the transistor, that is to say the product of its width W by its length L, as defined in relation to FIG. 1.

In the invention, an attempt is therefore made to record reliably the C(V) curves of an MOS structure, i.e. a gate-oxide-semiconductor stack especially adapted for nanometric or subnanometric processes.

Solutions to the problems of precision in the capacitance measurements have already been sought. In particular, techniques are known which make it possible to circumvent the stray elements introduced by the measuring apparatus.

U.S. Pat. No. 7,069,525 discloses a method for characterization of MOS structures by means of ring oscillators using inverters which are connected at their outputs to different loads formed by MOS capacitances with different gate lengths. The various currents measured in the inverters are used to deduce the values of the load capacitances per inverter stage. Thus, the value of the gate oxide capacitance and the gate length dispersion are measured by differentiation. However, the method does not integrate the quantum effects which need to be considered in order to determine the gate oxide capacitance. Furthermore, the measurements do not take into account the switching current associated with each inverter, which varies as a function of the charge of the inverter.

Another known measurement technique for measuring the value of an interconnection capacitance, based on the inverter charge, makes it possible through dynamic measurement to eliminate the switching current as well as the interference introduced by the stray capacitances due to the probes being used and the measuring apparatus. This technique is described in the publication by B. W. McGaughy, J. C. Chen, D. Sylvester, C. Hu, "A Simple Method for On-Chip Sub-Femto Farad Interconnect Capacitance Measurement," *IEEE Electron Device Letters*, Vol. 18, No. 1, pp. 21-23, January 1997. It is based on the use of two CMOS inverter, one charging an interconnection capacitance to be measured and the output of the other not being connected to any load. Suitably shaped control signals of the inverters make it possible to circumvent the switching current associated with each inverter.

U.S. Pat. No. 6,870,375 describes the use of a similar technique, again for measuring interconnection capacitances.

These interconnection capacitances are not of the same nature as the MOS capacitance. In particular, the interconnection capacitance does not have stray capacitances interfering with the measurement, and it has a constant value irrespective of the applied voltage.

Thus, although these techniques are highly suitable for measuring low interconnection capacitances with precision, they do not however make it possible to circumvent the other stray capacitances such as the stray capacitances belonging to the structure of the MOS transistor, or the problem of surface area precision. Moreover, we have seen that these stray capacitances are of the order of magnitude of the MOS capacitance which is intended to be measured with precision.

SUMMARY OF THE INVENTION

The invention firstly provides a test structure based on MOS transistors, which makes it possible to record C(V) curves reliably.

The invention defines a test structure which uses differences in dimensions of MOS transistors for cancelling by subtraction the various effects of the stray capacitances and of the imprecisions in the surface areas of the transistors.

The invention also concerns a measurement method using such a test structure, by which the stray effects associated with the measurements are also cancelled.

As characterized, the invention therefore relates to a capacitive structure having two semiconductor devices, a first and a second, each device comprising MOS transistors whose gates are all electrically connected together at a first node and whose sources and drains are all electrically connected together at a second node, the transistors of the two devices being of the same type, and whose dimensions are selected so that the sum of the lengths on the one hand, and the sum of the widths on the other hand, are respectively equal in the two devices, and so that the surface area difference $S_{equiv}$ between the two devices, given by the equation $S_{equiv}=\Sigma(L_i \cdot W_i)-\Sigma(L'_i \cdot W'_i)$, is nonzero, where $L_i$, $W_i$ respectively denote the length and the width of a transistor $T_i$ of the first device $DT_1$ of the pair; and $L'_i$, $W'_i$ respectively denote the length and the width of a transistor $T'_i$ of the second device $DT_2$.

In one embodiment of the invention, the two devices have the same number n of MOS transistors.

A method for using such a test structure to a measure a curve of capacitance as a function of voltage comprises the measurement of a capacitance curve as a function of voltage on each device, and calculating the resultant difference curve between the two devices divided by the surface area difference between the two devices.

The method may use a capacimeter.

In one variant, the test structure furthermore comprises one CMOS inverter per semiconductor device, making it possible to use a dynamic measurement method.

BRIEF DESCRIPTION OF DRAWINGS

Other advantages and characteristics of the invention are specified in the following description with reference to the drawings, which illustrate an embodiment of the invention given by way of nonlimiting example. In these drawings:

FIGS. 11 and 12 illustrate a second embodiment of a test structure according to the invention;

FIG. 13 illustrates another device for measuring the oxide capacitance of an MOS structure using a method of measuring the current in the inverters during switching;

DESCRIPTION OF DETAILED EMBODIMENTS

A test structure according to the invention for precisely characterizing an MOS stack has two semiconductor devices comprising MOS transistors whose dimensions are selected so that the sum of the lengths on the one hand, and the sum of the widths on the other hand, are respectively equal in the two devices, and so that the surface area difference of the two devices is nonzero.

Figure 1:
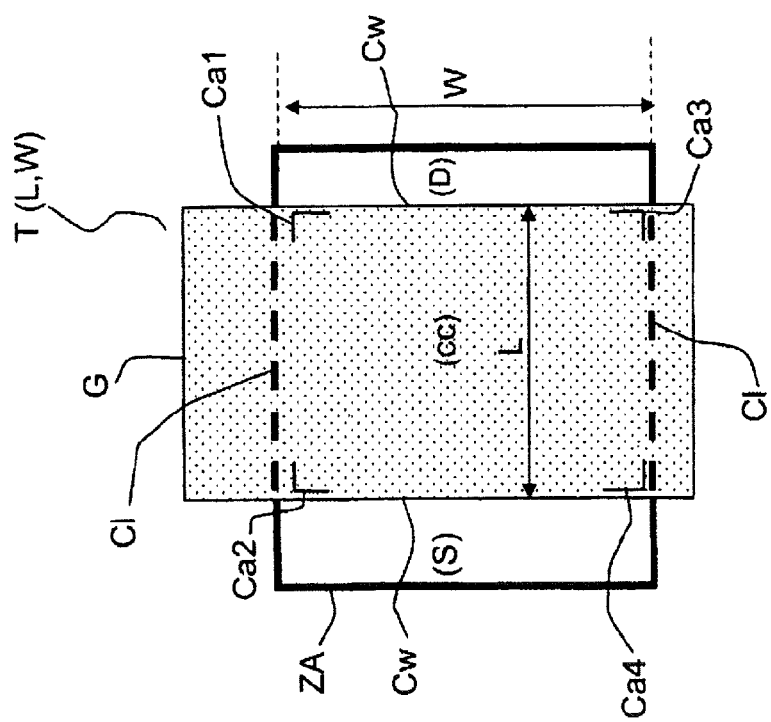
FIG. 1 is a simplified diagram showing the edge and corner capacitances of an MOS transistor with dimensions (L, W)

It may be recalled that the dimensions of an MOS transistor conventionally refer to the width W and the length L of the gate zone overhanging the active zone, as illustrated in FIG. 1. The surface area of this transistor is consequently given by the product of its width W by its length L. The associated MOS capacitance is the capacitance between the gate and the substrate (or the well, depending on the type of transistor), measured between the gate of the MOS transistor and the source, the MOS transistor having its source short-circuited to its drain (and optionally to a contact pin for biasing the well, in the case of a transistor formed in a well).

Measuring the capacitances on each of the devices separately, then calculating the difference between these two capacitances, is equivalent to measuring a capacitance of equivalent surface area equal to the surface area difference of the two devices. The stray effects induced by the two devices are cancelled in this measurement by subtraction.

Figure 6:
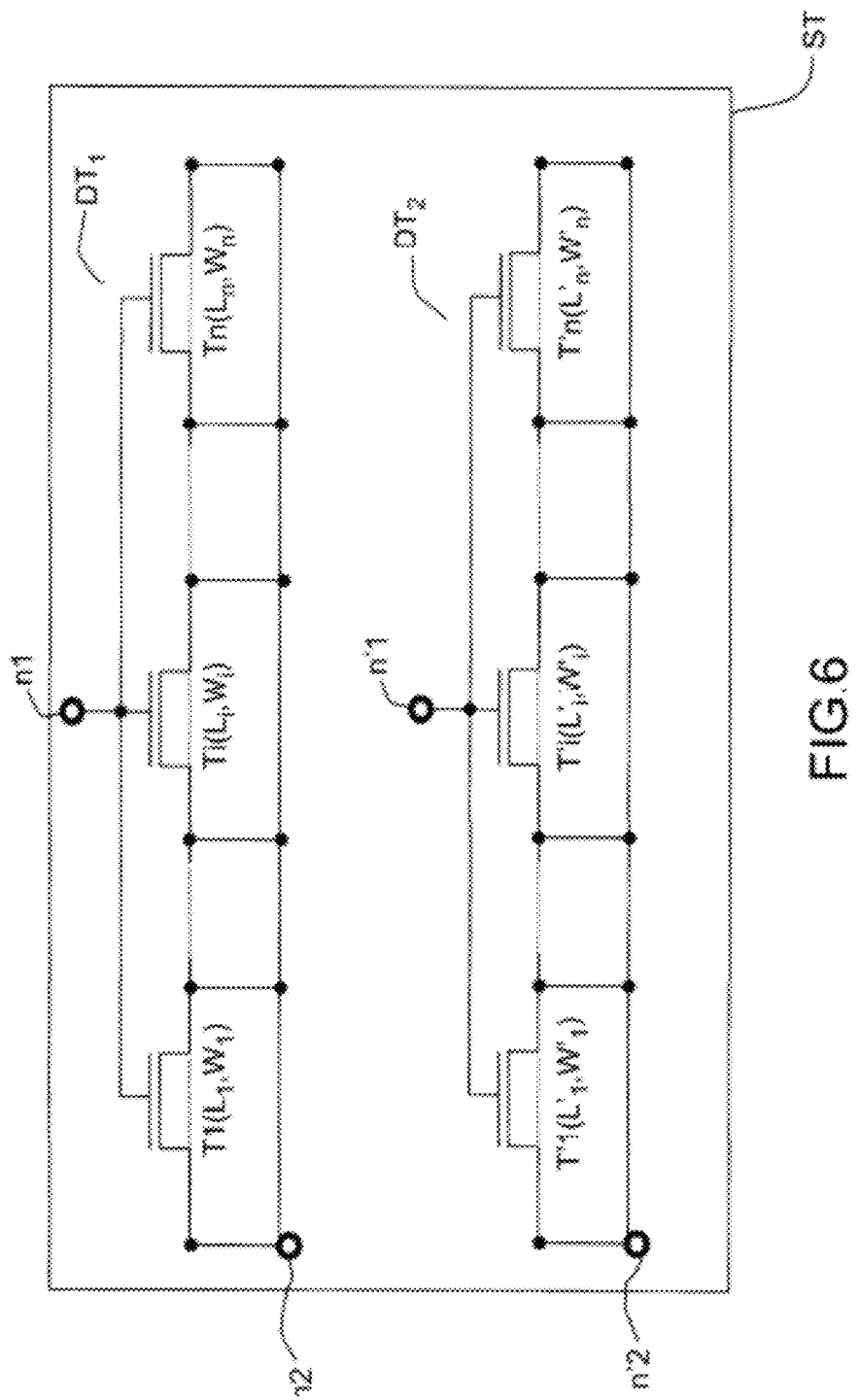
FIG. 6 is a general diagram of a test structure according to the invention.

A test structure ST according to one embodiment of the invention is illustrated in FIG. 6.

It comprises at least a first device $DT_1$ and a second device $DT_2$, which are formed on the same substrate. They are formed in proximity to one another, sufficiently close together so that the dispersion in the dimensions may be neglected.

The first device contains n transistors in parallel, n being an integer greater than or equal to 2, having their gates connected in common and their sources and drains connected in common, each transistor Ti, i=1 to n, being defined by its length $L_i$, its width $W_i$ and a surface area $S_i=L_i \cdot W_i$.

$DT_1$ is thus equivalent to an equivalent total capacitance of surface area $S1=\Sigma(L_i \cdot W_i)_{i=1 \, to \, n}$.

The second device also contains n transistors having their gates connected in common and their sources and drains connected in common, each transistor T'i, i=1 to n, being defined by its length $L'_i$, its width $W'_i$ (i=1 ... n) and a surface area $S'_i=L'_i \cdot W'_i$.

$DT_2$ is thus equivalent to an equivalent total capacitance of surface area $S2=\Sigma(L'_i \cdot W'_i)_{i=1 \, to \, n}$.

The dimensions of the transistors of the two devices are selected so that:

the sum of the lengths of the transistors Ti of the device $DT_1$ is equal to the sum of the lengths of the transistors T'i of the device $DT_2$:

$\Sigma(L_i)_{i=1 \, to \, n}=\Sigma(L'_i)_{i=1 \, to \, n}$;

the sum of the widths of the transistors $T_i$ of the device $DT_1$ is equal to the sum of the lengths of the transistors $T'_i$ of the device $DT_2$:

$\Sigma(W_i)_{i=1 \, to \, n}=\Sigma(W'_i)_{i=1 \, to \, n}$; and the difference in surface area, denoted $S_{equiv}$, between the surface areas S1 and S2 is nonzero: i.e. $S_{equiv}=\Sigma(L_i \cdot W_i)-\Sigma(L'_i \cdot W'_i) \neq 0$.

In each device, the n transistors have their gates electrically connected in common to a first node, n1 in $DT_1$ and n'1 in $DT_2$.

In each device, the n transistors have their sources and drains electrically connected in common to a second node, n2 in $DT_1$ and n'2 in $DT_2$.

The transistors of the two devices are all of the same type, with an n-type channel or a p-type channel. In the event that they are formed in wells, a well pin is provided which will then be connected in common with the source and drain connections.

The test structure ST of the invention makes it possible to measure a "difference" MOS capacitance between the two devices, corresponding to the capacitance of an MOS capacitance with an equivalent surface area $S_{equiv}$. Thus $$S_{equiv} = \Sigma(L_i \cdot W_i) - \Sigma(L'_i \cdot W'_i).\qquad\text{Eq.1}$$

This measurement is insensitive to the various sources of stray capacitances.

Furthermore, the "difference" equivalent surface area is also insensitive to the technological dispersions in the dimensions.

The ratio of the value of this "difference" MOS capacitance to the equivalent surface area gives a measurement of the MOS capacitance per unit area, which is reliable and precise for the technology in question.

The test structure ST according to the invention thus allows a measurement of capacitance per unit area which is very reliable and precise, and independent of the various stray elements and the dispersion of the technology. This measurement may use any measuring apparatus by which a C(V) curve can be recorded for each device, according to any well-known technique.

In practice, as illustrated in FIG. 7b, each of the nodes of the devices is connected to a test pad via a respective connection structure. The nodes n1 and n2 of the device $DT_1$ are thus respectively connected to the pads p1 and p2. Likewise, the nodes n'1 and n'2 of the device $DT_2$ are respectively connected to the pads p'1 and p'2.

The two measurement tips 30A and 30B of a capacimeter 30, typically an impedance analyzer, can thus be positioned on the pads p1 and p2 of the first device of the test structure ST, then on the pads p'1 and p'2 of the other device. The probes are typically positioned on the pads through a probe card arranged on the test structure (not shown).

The steps of the measurement method using a test structure according to the invention are as follows (FIG. 7a):

a)—measuring the capacitance as a function of the voltage for each of these two devices, $C_1(V)$ and $C_2(V)$ respectively, in similar measurement environments, employing the usual measurement means;

b)—calculating the difference between the characteristics of the two devices divided by the equivalent surface area $S_{equiv}$, i.e. $[C_1(V) - C_2(V)]/S_{equiv}$.

A characteristic C(V) per unit area is obtained, which is insensitive to the stray effects induced by the technology.

More precisely, as shown in FIG. 7b, in step a) the two tips are applied in the same way onto the two devices, that is to say in the same configuration: the two tips 30A and 30B are applied onto the two pads $p_1$ and $p_2$ of the first device $DT_1$ in order to record a first characteristic curve $C_1(V)$; and the two tips 30A and 30B are applied onto the two pads p'$_1$ and p'$_2$ of the second device $DT_2$ in order to record a corresponding second characteristic curve $C_2(V)$.

The curve per unit area which is obtained, $[C_1(V) - C_2(V)]/S_{equiv}$, is then processed in the known way in order to obtain the various parameters identifying the nature of the stack comprising the gate electrode/gate oxide/semiconductor, in particular its thickness or its flatband voltage.

Figure 2:
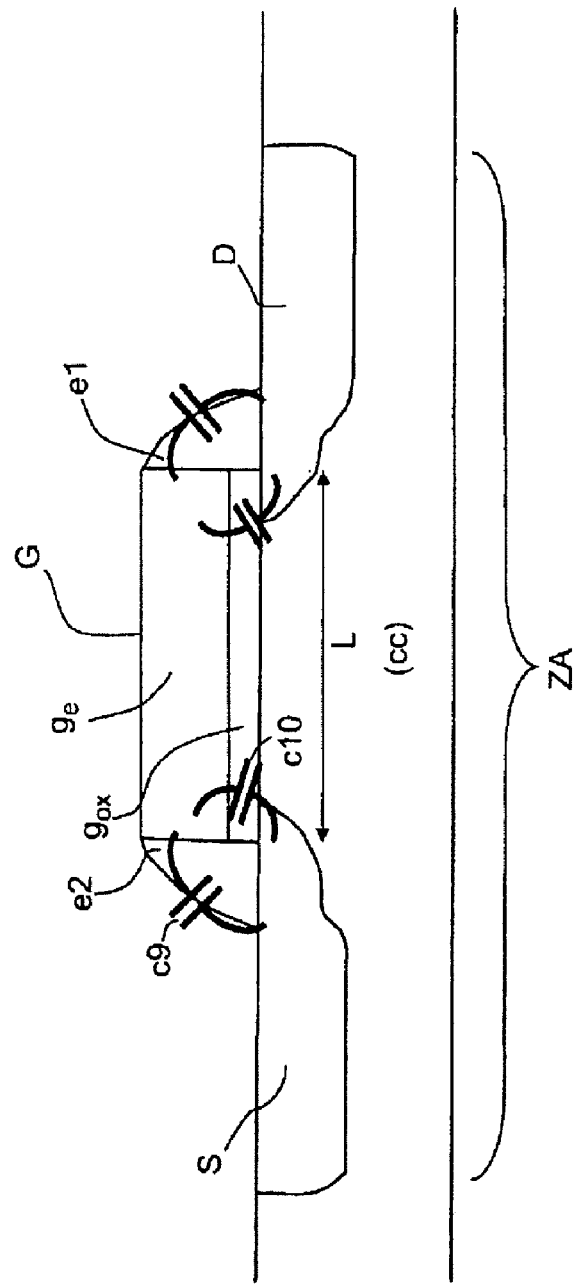
FIG. 2 is a cross section of an MOS transistor, demonstrating the stray capacitances of the gate edge on the active zone.

It is, in particular, insensitive to the stray capacitances of the MOS structure, that is to say the edge and corner capacitances described with reference to FIGS. 1 and 2. This is because the conditions for the number of transistors and their dimensions, in the two devices $DET_1$ and $DET_2$ of the test structure, mean that these two devices have the same equivalent perimeter: the total sum of the lengths and widths, and the same number of corners.

It is also insensitive to the dispersion in the dimensions (L, W) of the transistors. This is because the two devices are formed in proximity, for example with less than 1000 μm between the two devices, so that constancy of the technological dispersion for the dimensions in the two devices may be assumed. In view of the equality of the sums of the lengths and the sums of the widths between the two devices $DT_1$ and $DT_2$, and if δL and δW respectively denote the technological dispersions for the lengths L and the widths W, that is to say the difference between the design dimensions (on the reticles) and the real dimensions obtained, then the following equation is obtained:

$$\Sigma\{(L_i + \delta L) \cdot (W_i + \delta W)\} - \Sigma\{(L'_i + \delta L) \cdot (W'_i + \delta W)\} = \Sigma(L_i \cdot W_i) - \Sigma(L'_i \cdot W'_i) \qquad\text{Eq.2}$$

In other words, the equivalent surface area $S_{equiv}$ is in fact equal to $\Sigma(L_i \cdot W_i) - \Sigma(L'_i \cdot W'_i)$, where $L_i$, $W_i$, $L'_i$, and $W'_i$ are the design dimensions on the reticles.

Advantageously, equality of the stray capacitances associated with the tips and with the metal interconnections for each of the two devices may be ensured by producing identical connection structures between p1 and n1 on the one hand and p'1 and n'1 on the other hand, and between p2 and n2 on the one hand and p'2 and n'2 on the other hand (FIG. 7b). A connection structure is to be understood as the pad itself and the connection line between the node and this pad. Whatever lies between n1 and n2 on the one hand, and n'1 and n'2 on the other hand, will therefore not vary between the two devices $DT_1$ and $DT_2$ of the test structure.

Figure 3:
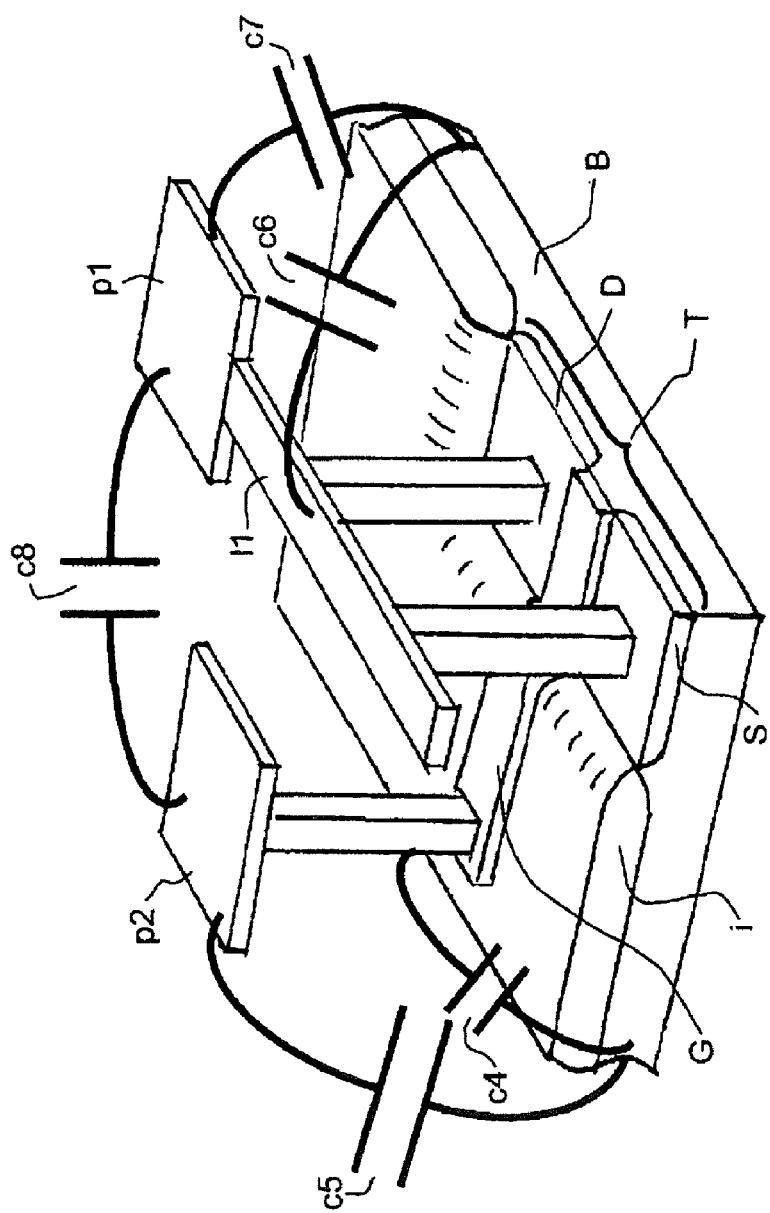
FIG. 3 illustrates the stray capacitances introduced by the interconnection lines and the test pads in the structure to be measured.
Figure 4:
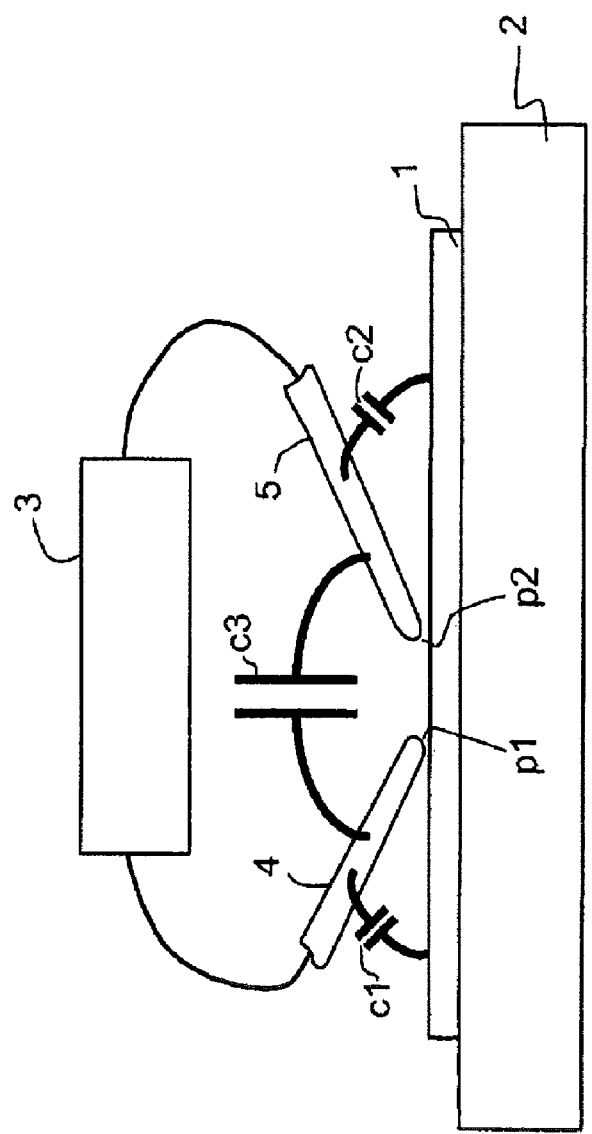
FIG. 4 illustrates the stray capacitances introduced by the test tips placed onto the test pads of the structure.

As illustrated in FIG. 7b, the pads of each device of the test structure are made to lie next to the same test tips by simple lateral displacement, for example by lateral displacement of the silicon substrate of the test structure along the arrow drawn in the figure. The measurements on the two devices are thus carried out in similar environments, making it possible to ensure insensitivity to the stray effects introduced by the probes and the measuring apparatus. More precisely, in this way it is possible to ensure that the stray capacitances associated with the tips and the interconnections and the measuring apparatus, which were described with reference to FIGS. 3 and 4, will be constant between the two measurements $C_1(V)$ and $C_2(V)$: their effects will be cancelled by subtraction when calculating the difference $C_1(V) - C_2(V)$.

In a simple embodiment of the invention, the dimensions of the transistors of one device are selected while taking the dimensions of the transistors of the other device into account, but by "associating" the lengths and widths differently so that the total length and the total width are each constant but so that the surface area difference is nonzero: $S_{equiv} \neq 0$.

Figure 8:
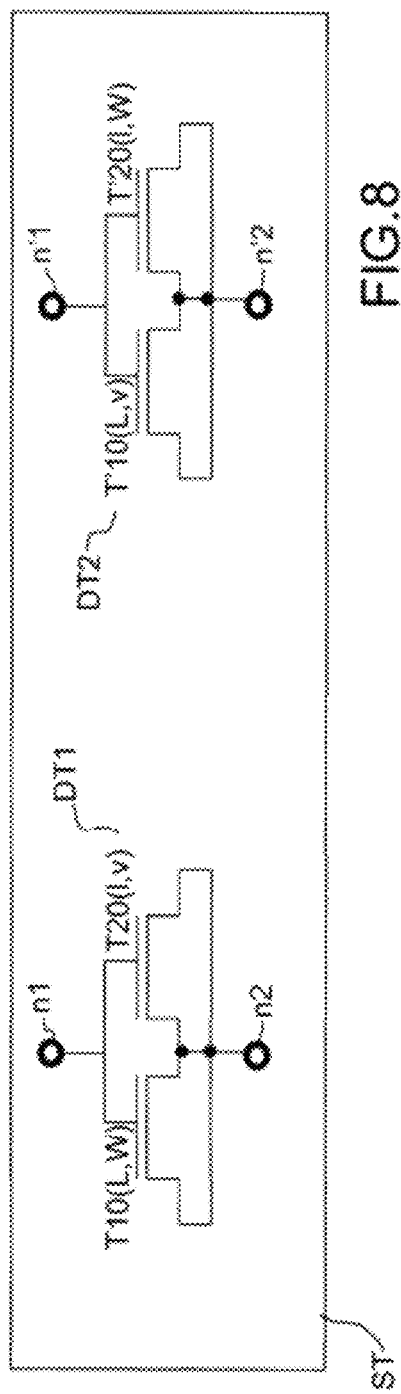
FIGS. 8 and 9 illustrate a first embodiment of a test structure according to the invention.

In a first example illustrating such an embodiment, and as shown in FIG. 8, the test structure comprises at least a first and a second device $DET_1$ and $DET_2$, each comprising n=2 MOS transistors.

The first device comprises a first transistor T10 of design length L and design width W, and a second transistor T20 of design length l and design width v, with L>l and W>v.

The second device comprises a first transistor T'10 of design length L and design width v, and a second transistor T'20 of design length l and design width W.

Figure 9:
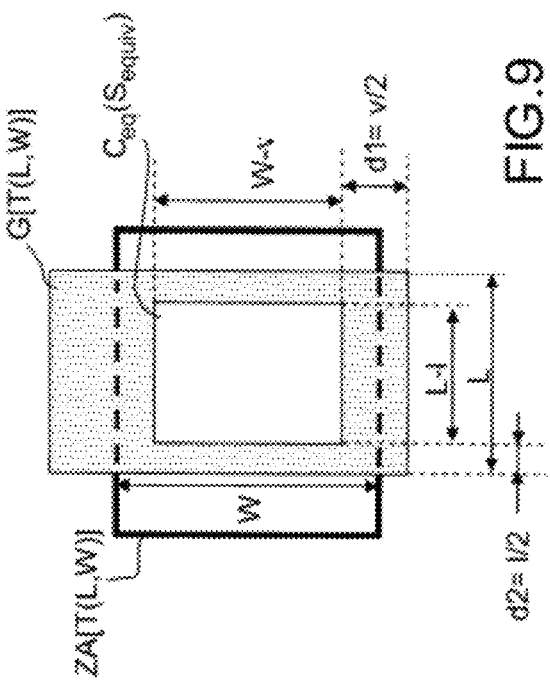

As illustrated in FIG. 9, the equivalent capacitance Ceq obtained by taking the difference between these two devices has a length (L−l) and a width (W−v).

With the conditions for the dimensions L, W, l, v, this equivalent capacitance Ceq can be "inscribed" in a central part of the surface of a transistor having L as its design length and W as its design width (like T10). An expedient choice of l and v furthermore advantageously makes it possible to remove the gate edge effects by subtraction.

Figure 10C:
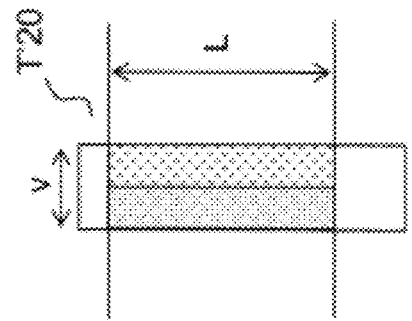
FIGS. 10a to 10d illustrate an aspect of the invention for defining an advantageous equivalent MOS structure.
Figure 10B:
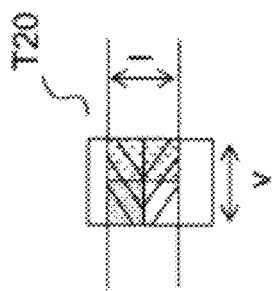
Figure 10A:
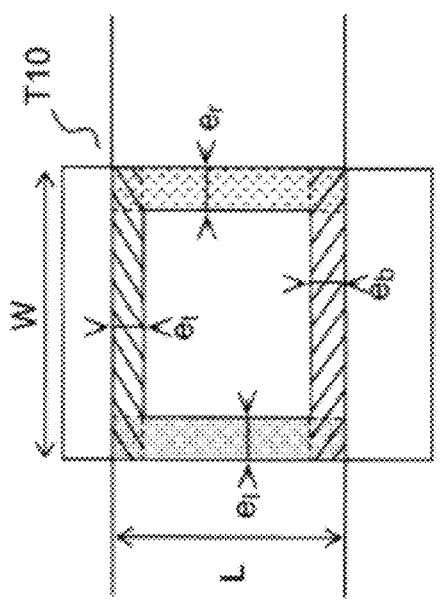
Figure 10D:
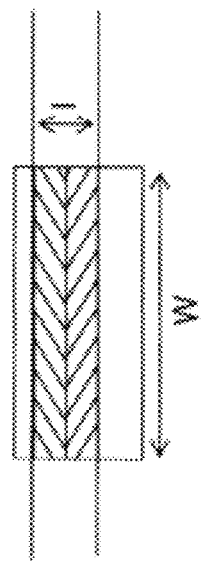

Specifically, as represented in FIG. 10a, the gate oxide of an MOS transistor is not always homogeneous over the entire length L and over the entire width W of the gate, in particular on the gate edges which correspond to the etching edges. The two zones zt (hatched in one direction) and zb (hatched in the other direction) may be seen, corresponding to the edges of the active zones below the gate over the width W, in which the gate oxide is affected by the edge effects along this dimension, and the two zones zl (dotted) and zr (marked with crosses) corresponding to the gate edges along the width L, in which the gate oxide is affected by the edge effects along this dimension. If l and v are selected so that the width v of the transistors T20 and T'20 (FIGS. 10b and 10c) corresponds to the sum of the widths $e_l$ and $e_r$ of the two zones zl and zr, and so that the length l of the transistors T20 and T'10 (FIGS. 10b and 10d) is equal to the sum of the lengths $e_t$ and $e_b$ of the two zones zt and zb, then an equivalent MOS structure without edge effects is obtained.

Other combinations are possible if only certain zones are intended to be excluded, for example only the "horizontal" edge zones zt and zb.

FIGS. 11 and 12 illustrate a second example of a simple embodiment of the invention, according to which the dimensions of the transistors of one device of the test structure are selected while taking the dimensions of the transistors of the other device into account, but by associating the lengths and widths differently so that the total length and the total width are constant but so that the surface area difference is nonzero.

Here, the test structure ST comprises two devices $DET_1$ and $DET_2$ in which each device consists of n=three MOS transistors. The first device comprises a first transistor T100 of design length $l_1$ and design width $v_1$, a second transistor T200 of design length $l_2$ and design width W, and a third transistor T300 of design length L and design width $v_2$ (L>$l_2$>$l_1$ and W>$v_2$>$v_1$).

The second device comprises a first transistor T100' of design length $l_2$ and design width $v_2$, a second transistor T200' of design length $l_1$ and design width W, and a third transistor of design length L and design width $v_1$.

The equivalent capacitance Ceq obtained by taking the difference between these two devices is a ring which may be inscribed in the surface of a transistor of design length L and design width W, in a central part of the surface.

This ring is characterized by an external length (L−$l_1$), an internal length (L−$l_2$), an external width (W−$v_1$) and an internal width (W−$v_2$). This is illustrated in FIG. 12: it is the part left blank between the dotted part at the centre and the hatched part at the periphery.

Comparing the transistor defined by the dimensions (L,W), as illustrated in FIG. 10a, and the ring illustrated in FIG. 12, it will be understood that owing to the variation of $l_1$, $v_1$, $l_2$, $V_2$, the equivalent surface of the test structure ST has a ring shape which is inscribed in a surface of size L·W, at a distance from the perimeter which depends on the dimensions $l_1$, $v_1$, $l_2$, $V_2$. By varying the dimensions l1, v1, l2, v2, the distance of the said ring from the parameter of the said surface can be varied. This advantageously makes it possible to check the homogeneities of the gate stack along the distance of the stack delimited by the ring, at the perimeter of the surface L·W (i.e. at the edge of the G of the transistor T100).

Figure 7:
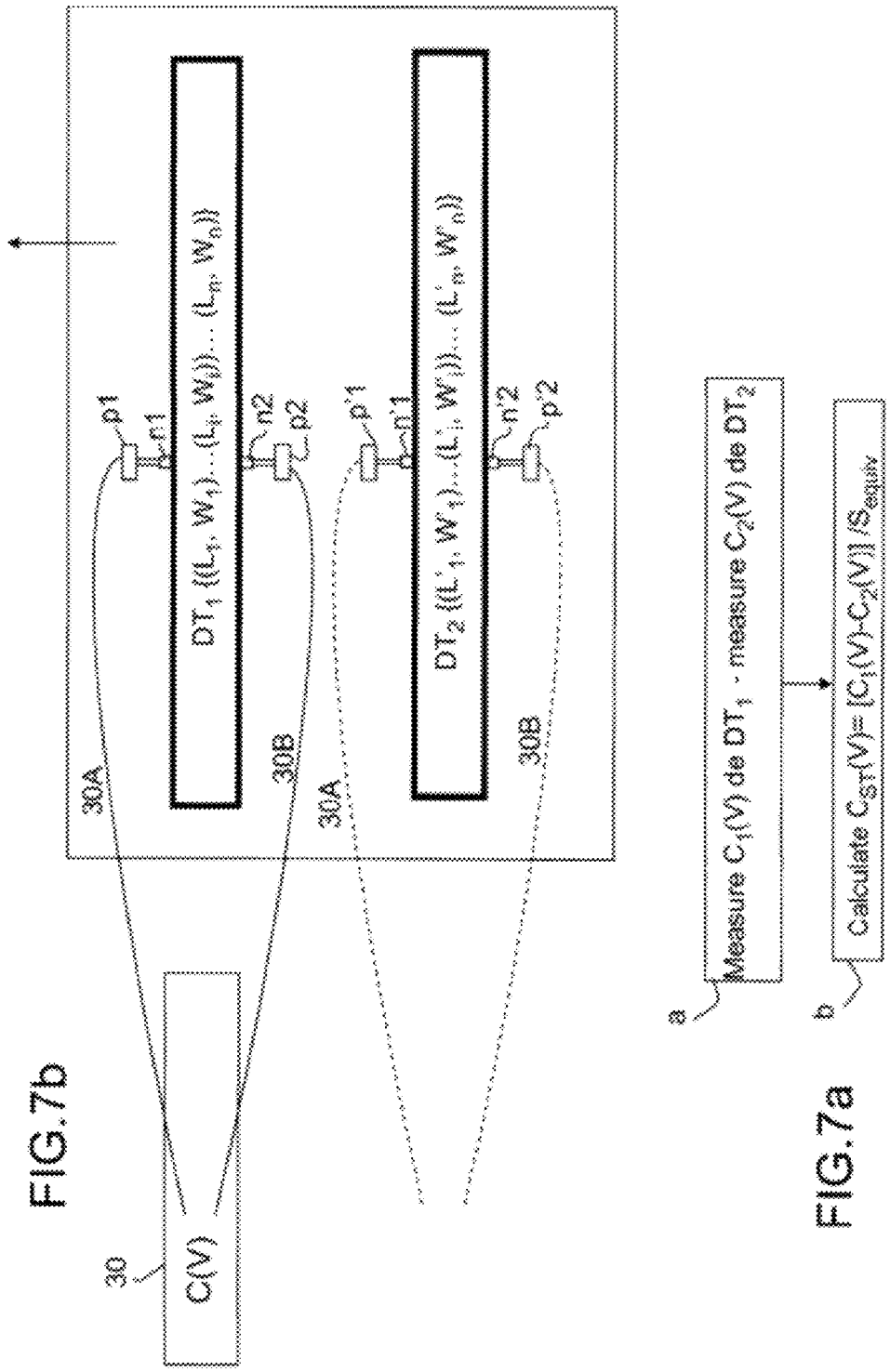
FIGS. 7a and 7b schematically illustrate a measurement method and an associated measuring device using a test structure according to the invention.

The test structure according to the invention, which has just been described with reference to FIGS. 6 to 12, may be used as is well known in a method for measuring a characteristic C(V) as illustrated in FIG. 7a, with a capacimeter or impedance analyzer, in order to measure the two curves $C_1(V)$, $C_2(V)$ (step a) of the method) and calculate their difference, divided by the equivalent surface area given in Eq.1 (step b) of the method).

The proposed test structure thus allows the MOS stack to be characterized simply, precisely and reliably by means of a capacimeter. It is simple and economical to produce.

According to another aspect of the invention, by placing the devices each as the load of a suitably controlled CMOS inverter, this curve can be recorded by a dynamic measurement method based on measuring the current in each inverter.

Such a dynamic measurement technique is described in the aforementioned publication by McGaughy et al., for the measurement of an interconnection capacitance.

Figure 5A:
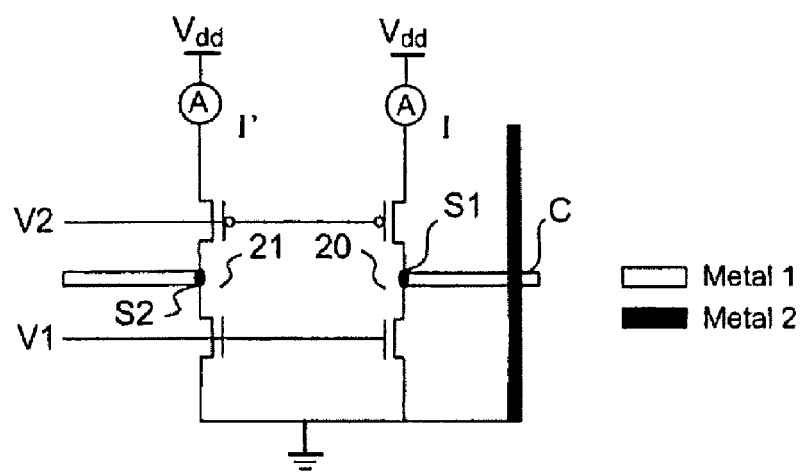
FIGS. 5a and 5b illustrate the device for measuring interconnection capacitance as proposed in the publication by McGaughy et al.
Figure 5B:
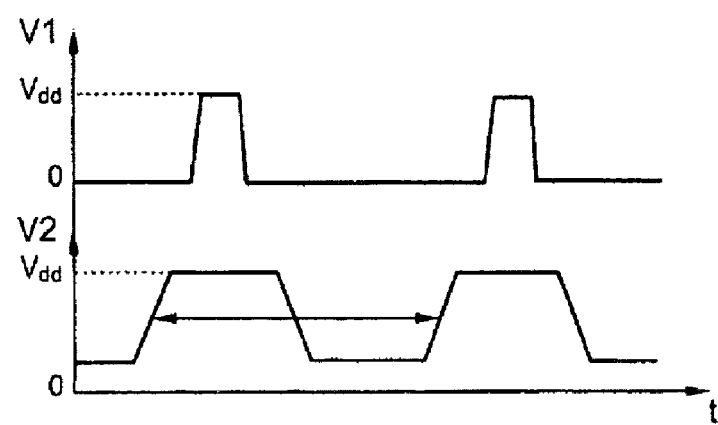

The technique described in this publication is illustrated in FIGS. 5a and 5b of the present application.

The interconnection capacitance C to be measured, produced by the crossover of two metal lines 10 and 11, each at a different topological level, Metal1 and Metal2, is placed as a load capacitance of a first CMOS inverter 20, that is to say between the output node S1 of this inverter and earth. A second CMOS inverter 21 is provided, which is identical to the first except that its output S2 is not connected to a load capacitance (FIG. 5a). The two inverters 20, 21 are supplied between a supply voltage Vdd and earth, and they are respectively controlled by a periodic pulse signal of the same frequency, V1 and V2 respectively, in which the high level of the pulse corresponds to the level of the DC voltage Vdd (FIG. 5b).

The signals V1 and V2 are signals which do not overlap, so that at most one transistor in an inverter conducts current at any time, which makes it possible to eliminate the switching currents associated with each inverter. A measurement of the load currents I and I' in each inverter 20, 21 is carried out.

In order to circumvent the stray capacitances of the MOS transistors of the inverters, the inverters are selected to be identical and formed in proximity to one another, so that they have substantially the same stray capacitances: the effects of the stray capacitances of the two inverters are then cancelled out completely in the difference I−I', and the value of the interconnection capacitance C is thus obtained by the following equation:

$$(I-I')/f=CV_{dd}, \qquad (Eq.3).$$

where $V_{dd}$ is the voltage amplitude of the signals V1 and V2 and the bias voltage of the two inverters, f is the frequency of the voltage signal applied to the inverters, and I and I' are the supply currents in the inverters.

C is invariant with the voltage. A measurement of the currents I and I' for given Vdd and f therefore gives the value of C.

In order to check the measurement, optionally Vdd or the frequency f may be varied: the value C of the interconnection capacitance is equal to the slope of the corresponding curve I(Vdd) or I(f) with respect to the frequency and the measurement voltage Vdd, respectively.

In the invention, an attempt has been made to apply in this dynamic measurement technique in order to measure the characteristic C(V) of an MOS capacitance by using a test structure according to the invention. The idea is to use the two devices $DT_1$ and $DT_2$ of the test structure according to the invention, each as a load capacitance of an inverter, according to the principle explained in the aforementioned application.

Implementation of the principle of dynamic measurement associated with a test structure ST according to the invention, for example the structure of FIG. 8 or FIG. 11, is illustrated in FIG. 13.

In addition to the two devices $DT_1$ and $DT_2$, the test structure ST comprises two CMOS inverters INV1 and INV2 connected between two supply pads: INV1 is connected between the pads VDD1 and Vss; and INV2 is connected between the pads VDD2 and Vss.

The first inverter INV1 charges the first device $DT_1$ of the test structure: its output $S_1$ is connected to the node n1. The node n2 is connected to the base of the inverter, typically to earth Vss. The second inverter INV2 charges the second device $DT_2$: its output $S_2$ is connected to the node n'1. The node n'2 is connected to the base of the inverter, typically to earth Vss.

The gates of the p-type transistors of the two inverters are controlled by the same signal $V_p$ applied to the pad VP, and the gates of the n-type transistors of the two inverters are controlled by the same signal $V_n$ applied to the pad VN. The high level of the signals $V_p$ and $V_n$ and the voltage level applied to the pads VDD1 and VDD2 in order to bias the inverters are identical and equal to Vdd.

A control signal $V_P$ of frequency f is applied to the p-type MOS transistors of the inverter, which controls closure of the p-type transistors (i.e. in the on state) for a closure time or conduction time $t_p$.

A control signal $V_n$ of frequency f is applied to the n-type MOS transistors of the inverter, which controls closure of the n-type transistors for a closure time $t_n$.

For given Vdd, f and $t_p$, the current I1, I2 in each inverter INV1, INV2 is measured.

The current I1, measured in the inverter INV1 for given f and Vdd and tp, is then written $$I1/f = Q_{inv1} + Q_{DT1} + I_{f1} \cdot t_p \quad \text{Eq.4}$$

where $t_p$ is the conduction time of the p-type transistor; $Q_{inv1}$ is the switching charge inherent to the measurement inverter INV1 and to its stray capacitances, $I_{f1}$ is the leakage current of the capacitance to be measured between the nodes n1 and n2 of the device $DT_1$ for a given voltage level Vdd, and $Q_{DT1}$ is the charge of the device $DT_1$ for a voltage Vdd.

The current I2 measured in the inverter INV2 for given f and Vdd and $t_p$ is obtained in the same way, and we have $I2/f = Q_{inv2} + Q_{DT2} + I_{f2} \cdot t_p$ (Eq.4 applied to the inverter INV2 charging $DT_2$).

Equation Eq.3 of the publication by MacGaughy is not in fact applicable, because the capacitance intended to be measured in the invention is no longer constant with the voltage.

In the publication by MacGaughy, the capacitance C to be measured (interconnection capacitance) would not induce any leakage: this was an interconnection capacitance, hence the linear function of voltage expressed by Eq.3.

This is no longer the case for the MOS capacitances which are intended to be measured between the nodes n1 and n2 of the device $DT_1$, and between the nodes n'1 and n'2 of the device $DT_2$. Likewise, the current in the inverter only makes it possible to measure the charge of a capacitance, and not the capacitance.

Furthermore, there is a leakage current $I_{f1}$, $I_{f2}$ in each of the devices $DT_1$ and $DT_2$ during the conduction time $t_p$ of the transistor. This leakage current varies with the voltage. It is an unknown which perturbs the measurement, and it should therefore be circumvented.

Figure 14:
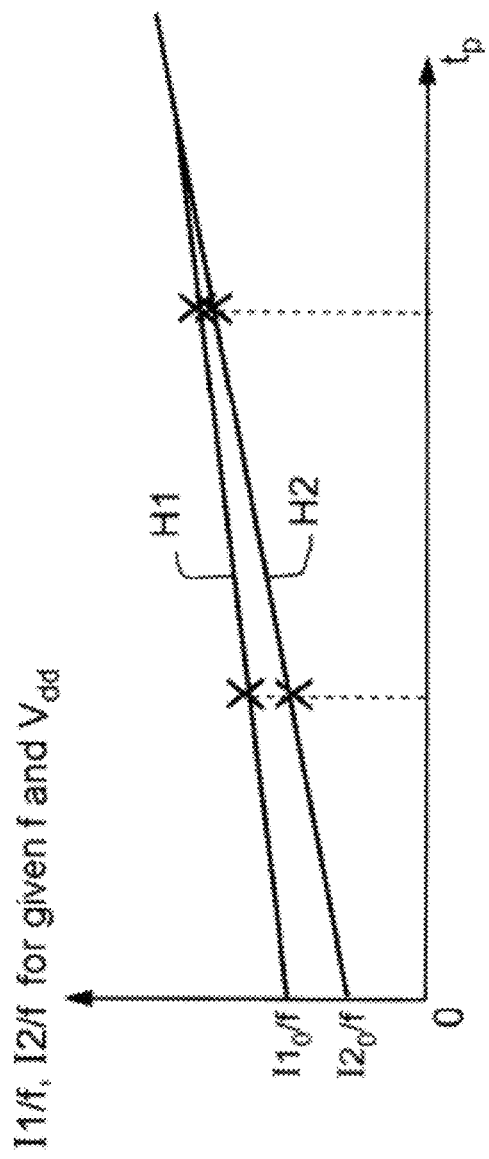
FIG. 14 illustrates the principle of extracting the charge difference between the two devices of the MOS structure according to the invention with such a measurement method.

In the invention, and as illustrated in FIG. 14, this term is circumvented by measuring in each inverter the value of the ratio of measured current to frequency in equation Eq.4, for various values of $t_p$ with constant Vdd and f, in order to be able to plot a curve of variation in this quotient as a function of conduction time and extrapolate to the origin: a value of the ratio of measured current to frequency corresponding to a zero conduction time $t_p$ is obtained.

By selecting different values of $t_p$, each such that they allow full charging (to Vdd) of the capacitance to be measured, the leakage current is then a linear function of $t_p$. It is now easy to extrapolate the obtained straight line to the origin: a measurement of the ratio of measured current of frequency at zero $t_p$ is obtained by extrapolation, which removes the charge due to the leakage current in equation Eq.4.

For the inverter INV1 loading the device $DT_1$ of the test structure, the value $I1_0/f$ at zero $t_p$ is thus determined:

$$I1_0/f = Q_{inv1} + Q_{DT1}. \quad [\text{Eq.5A}]$$

The value $I2_0/f$ at zero $t_p$ is determined similarly:

$$I2_0/f = Q_{inv2} + Q_{DT2}. \quad [\text{Eq.5B}]$$

The inverters INV1 and INV2 are identical (i.e. in particular with the same geometries for their n-type transistors N and for their p-type transistors) and formed very close together, typically less than 1000 micrometres apart. Thus, as in the aforementioned publication, it may be assumed that their respective charges $Q_{inv1}$ and $Q_{inv2}$ are equal.

In the difference between the two curves given by Eq.5A and Eq.5B, the charges associated with the inverters are thus cancelled and the value of the difference charge at zero $t_p$ between the two devices is obtained, for given f and Vdd, which is written $(I1_0 - I2_0)/f = Q_{DT1} - Q_{DT2}$, for given f and Vdd.

For constant f, by varying the value of Vdd, the curve of the difference charge at zero $t_p$ as a function of Vdd can thus be constructed point by point: $Q_{DT1} - Q_{DT2} = F(Vdd)$.

Calculating the derivative of this curve gives the curve of difference capacitance as a function of the voltage between the two devices $DT_1$ and $DT_2$, which is desired:

$$\delta F/\delta V = \delta(Q_{DT1} - Q_{DT2})/\delta V = C_1(V) - C_2(V).$$

In practice, the voltage Vdd is varied in a range around the nominal value defined for the technology, the limits of the range being on the one hand the maximum acceptable voltage at the terminals of the transistors and on the other hand the minimum voltage to be applied in order to obtain switching of the transistors of the inverters.

A corresponding test structure will therefore integrate two identical CMOS inverters on the same substrate (FIG. 13), each charging one of the two devices $DT_1$ and $DT_2$.

All these elements are formed in proximity so as to eliminate the stray effects by calculating the difference, as explained, both for the effects of dispersion in the dimensions and the charges associated with the inverters.

This test structure has 5 contact pads VDD1, VDD2, VP, VN and Vss for delivering the bias voltage of the inverters and the control voltages $V_p$ and $V_n$ necessary for the measurement.

In a corresponding measurement method, wave trains of the same frequency f are applied as control signals $V_p$ and $V_n$ of the transistors of the two inverters, such that the closure times $t_p$ of the p-type transistor and $t_n$ of the n-type transistor of each inverter are separate (FIG. 13).

Figure 15:
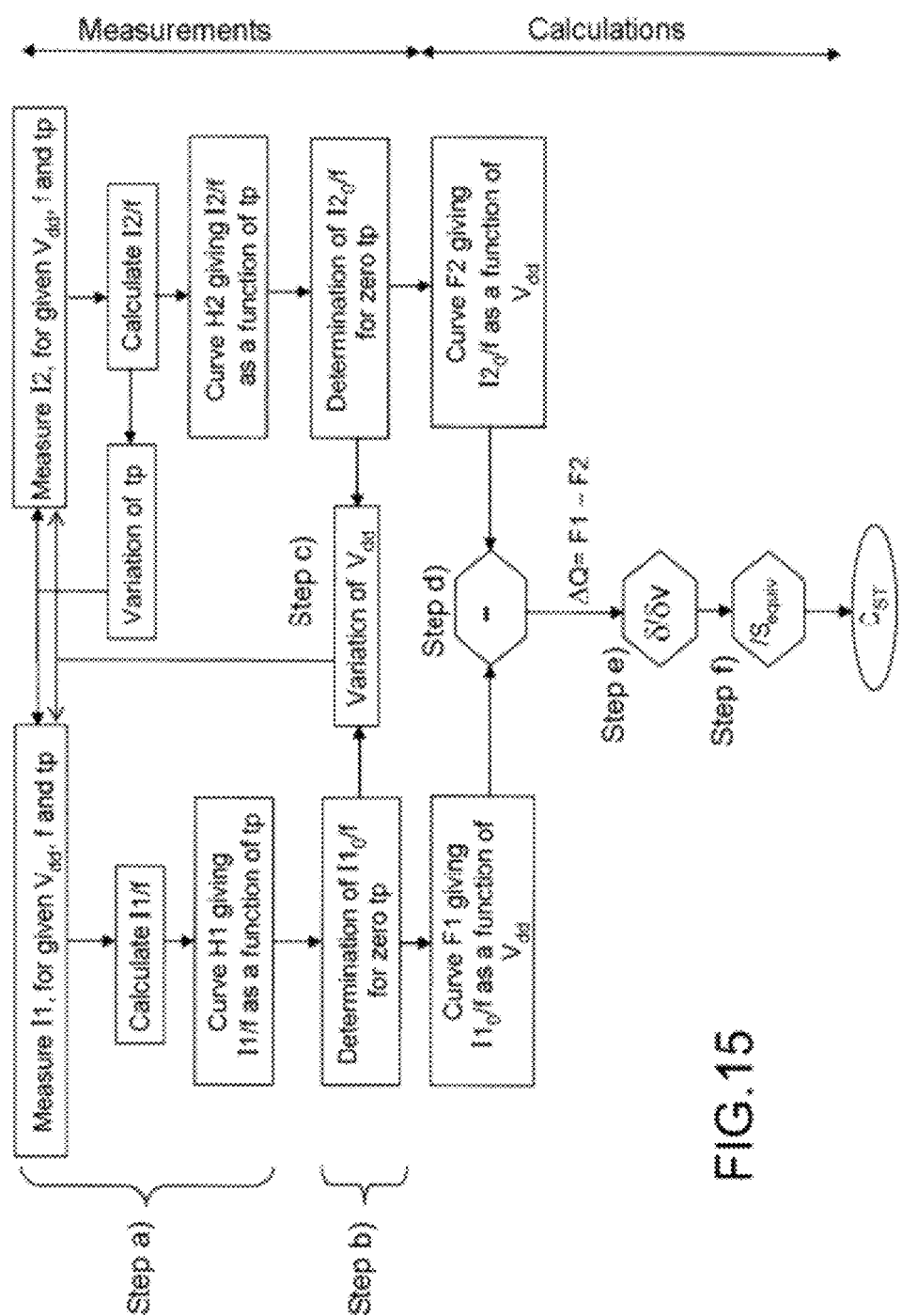
FIG. 15 is a flow chart of a measurement method corresponding to FIGS. 13 and 14.

The measurement of the curve $C_{ST}(V)$ of difference capacitance between the two devices $DT_1$ and $DT_2$ of the test structure may comprise the following steps, as illustrated in FIG. 15:

a)—measuring the supply currents I1 and I2 of each inverter for a given frequency f, supply level Vdd and conduction time $t_p$, and calculating the ratio of the current over the frequency I1/f and I2/f;

b)—repeating the measurement in a) for various values of the conduction time $t_p$; plotting the two curves H1 and H2 respectively giving I1/f and I2/f as a function of the conduction time $t_p$ and extrapolating to the origin in order to obtain the values $I1_0/f$ and $I2_0/f$ extrapolated to zero $t_p$, as illustrated in FIG. 14;

c)—repeating steps a) and b) for various values of Vdd at constant f, in order to obtain the curves F1 and F2 respectively giving $I1_0/f$ and $I2_0/f$ as a function of Vdd;

d)—calculating the difference between these two curves F1 and F2, in order to obtain the curve of the difference charge $\Delta Q = Q_{DT1} - Q_{DT2}$ between the two devices $DT_1$ and $DT_2$ as a function of the voltage Vdd;

e)—calculating the derivative $\delta\Delta Q/\delta V$ of this curve with respect to voltage, giving the curve of difference capacitance between the two devices as a function of the voltage Vdd;

f)—calculating the curve $C_{ST}(V)$ of difference capacitance between the two devices per unit area as a function of the voltage, by taking the equivalent surface area $S_{equiv}$ defined in equation Eq.1 as the surface area: $C_{ST}(V) = (\delta\Delta Q/\delta V)/S_{equiv}$.

The measurement thus comprises a measurement phase with a first loop of varying $t_p$ comprising steps a) and b), contained in a second loop of varying Vdd comprising step c), and a calculation loop comprising steps d), e) and f).

It will be noted, as revealed by FIG. 15, that the variation loops of $t_p$ and Vdd applied to the two devices are the same.

In practice, step b) of extrapolating for given f and Vdd may be obtained by two measurements, corresponding to two different values of the closure time $t_p$ of the p-type transistors which are sufficient to allow full charging of the capacitance to be measured: that is to say $t_p$ is such that Vdd is found between the nodes n1 and n2 of the device $DT_1$ and between the terminals n'1 and n'2 of the device $DT_2$.

The capacitance-voltage characteristic can thus be plotted and processed according to the conventional means for extracting MOS capacitances, and parameters identifying the nature of the gate-oxide-semiconductor stack can be identified, more particularly its EOT and its flatband voltage FBV.

The particular exemplary embodiments of the devices $DT_1$ and $DT_2$ specified with reference to FIGS. 6 to 12 may be applied equally well with one or other of the two measurement methods explained, with a capacimeter or with inverters.

The invention is not limited to the exemplary embodiments more particularly described. The person skilled in the art will know how to apply the principles of the invention in order to produce a test structure according to the spirit of the invention for cancelling the various stray effects by measuring a curve of difference capacitance between two $DT_1$ and $DT_2$ devices according to the invention.

The invention claimed is:

1. A MOS capacitance test structure comprising:
a first semiconducting device comprising a first plurality of MOS transistors, each transistor of the first plurality of MOS transistors having a gate electrically connected to a first node, and a source and a drain both electrically connected to a second node; and
a second semiconducting device, comprising a second plurality of MOS transistors of the same transistor type as the first plurality of MOS transistors, each transistor of the second plurality of MOS transistors having a gate electrically connected to a third node, and a source and a drain both electrically connected to a fourth node, wherein:
a sum of the lengths of each transistor of the first plurality of MOS transistors is substantially the same as the sum of the widths of each transistor of the second plurality of MOS transistors, so that a surface area difference $S_{equiv}$ between the first and second semiconducting device is nonzero, as determined in accordance with the following relationship:

$$S_{equiv} = \Sigma(L_i \times W_i) - \Sigma(L'_i \times W'_i), \text{ where:}$$

$L_i$, $W_i$ respectively denote the length and the width of a transistor $T_i$ of the first semiconducting device;
$L'_i$, $W'_i$ respectively denote the length and the width of a transistor $T'_i$ of the second semiconducting device; and
x indicates multiplication.

2. The test structure according to claim 1, wherein the first and second semiconducting devices have the same number n of MOS transistors.

3. The test structure according to claim 2, wherein n=2.

4. The test structure according to claim 3, wherein:
the first semiconducting device comprises a first transistor with a first length L and a first width W, and a second transistor with a second length l and a second width v, where L>l and W>v;
the second semiconducting device comprises a third transistor, the length of which is equal to the first length L and the width of which is equal to the second width v, and a fourth transistor, the length of which is equal to the second length l and the width of which is equal to the first width W.

5. The test structure according to claim 2, wherein n=3.

6. The test structure according to claim 5, wherein:
the first semiconducting device comprises a first transistor with a first length l1 and a first width v1, a second transistor with a second length l2 and a second width W, and a third transistor with a third length L and a third width v2, with L>l2>l1 and W>v2>v1; and
the second semiconducting device comprises a fourth transistor, the length of which is equal to the second length l2 and the width of which is equal to the third width v2, a fifth transistor, the length of which is equal to the first length l1 and the width of which is equal to the second width W, and a sixth transistor, the length of which is equal to the third width L and the width of which is equal to the first width v1.

7. The test structure according to claim 1, wherein the first and second semiconducting devices further comprise a first connection structure for connecting the first node to a first test pad and a second connection structure for connecting the second node to a second test pad.

8. The test structure according to claim 7, wherein the first connection structure and the second connection structure are respectively identical for the first and second semiconducting devices.

9. The test structure according to claim 1, further comprising two substantially identical CMOS inverters each having one or more p-type transistors and one or more n-type transistors, each inverter charging a respective one of the first and the second semiconducting devices, the p-type transistors of the two inverters receiving a first common control signal and the n-type transistors of the two inverters receiving a second common control signal, the control signals of the p-type and n-type transistors being of a non-overlapping type.

10. The test structure according to claim 9, wherein the two inverters are formed at a distance of about 1000 micrometers or less between the two inverters.

11. A method for using a test structure in order to record a curve of difference capacitance as a function of a voltage between a first and a second device of the test structure, each device comprising:

a plurality of MOS transistors whose gates are all electrically connected together at a first node and whose sources and drains are all electrically connected together at a second node, wherein the dimensions of the transistors are selected so that the sum of the lengths of the transistors of the first device is substantially equal to the sum of the widths of the transistors of the second device, and so that the surface area difference $S_{equiv}$ between the first and second device is nonzero, as determined in accordance with the following relationship:

$S_{eqiv} = \Sigma(L_i \times W_i) - \Sigma(L'_i \times W'_i)$, where:

$L_i$, $W_i$ respectively denote the length and the width of a transistor $T_i$ of the first device;

$L'_i$, $W'_i$ respectively denote the length and the width of a transistor $T'_i$ of the second device, and x indicates multiplication, the method comprising the steps of:
  determining a capacitance as a function of a voltage applied to each of the first and second devices, to produce a first and second capacitance curve; and
  calculating a difference between the first and second capacitance curves to produce the curve of difference capacitance as a function of the voltage, expressed per unit area by division by the equivalent surface area $S_{equiv}$ of the test structure.

12. The method according to claim 11, wherein each of the devices comprises a first connection structure for connecting the first node to a first test pad and a second connection structure for connecting the second node to a second test pad, wherein voltages are applied to the terminals of the first and second pads of each of the first and second devices by use of a capacimeter.

13. The method according to claim 12, wherein the first connection structures and the second connection structures are substantially identical for the first and second devices.

14. The method according to claim 11, wherein the test structure further comprises two substantially identical CMOS inverters each having one or more p-type transistors and one or more n-type transistors, each inverter charging a respective one of the first and the second devices, the p-type transistors of the two inverters receiving a first common control signal and the n-type transistors of the two inverters receiving a second common control signal, the control signals of the p-type and n-type transistors being of a non-overlapping type, the method applying switching control signals at a frequency f to the p-type and n-type transistors to produce a closure time of the p-type transistors which is different than a closure time of the n-type transistors, and the method comprising for each inverter and an associated load device, the steps of:
  measuring a supply current of each inverter, for a predetermined switching frequency and a predetermined supply voltage of the inverters, as a function of a conduction time of the p-type transistor in order to obtain a first curve giving a ratio of the measured supply currents to switching frequency, as a function of the conduction time closure time;
  extrapolating the aid]] first curve to an origin, to obtain a value of the ratio of measured supply current to switching frequency extrapolated to the origin, corresponding to a zero closure time of the p-type transistor;
  repeating the steps of measuring the supply current for each inverter and extrapolating the first curve to the origin, for different predetermined values of the supply voltage, to obtain a second curve providing the ratio of supply current extrapolated to the origin to switching frequency, as a function of the supply voltage;
  calculating a curve of difference capacitance per unit area between the two devices as a function of the supply voltage, comprising the steps of:
  calculating a difference curve between the second curves;
  calculating a derivative of the difference curve with respect to the supply voltage; and
  dividing by the equivalent surface area $S_{equiv}$ of the test structure.

15. The method according to claim 14, wherein the two inverters are formed at a distance of about 1000 micrometers or less between the two inverters.

* * * * *